United States Patent

Pulz

[11] Patent Number: 6,054,852
[45] Date of Patent: Apr. 25, 2000

[54] PROCESS AND DEVICE FOR RECOVERING SIGNALS FROM NARROW-BAND, OPTICALLY PUMPED MAGNETOMETERS

[75] Inventor: Eberhard Pulz, Niemegk, Germany

[73] Assignee: Geo-Forschungszentrum Potsdam, Potsdam, Germany

[21] Appl. No.: 08/945,261

[22] PCT Filed: Apr. 25, 1996

[86] PCT No.: PCT/EP96/01738

§ 371 Date: Oct. 17, 1997

§ 102(e) Date: Oct. 17, 1997

[87] PCT Pub. No.: WO96/34295

PCT Pub. Date: Oct. 31, 1996

[30] Foreign Application Priority Data

Apr. 25, 1995 [DE] Germany .......................... 195 15 173

[51] Int. Cl.$^7$ .................................................. G01V 3/00
[52] U.S. Cl. .......................................... 324/304; 324/305
[58] Field of Search .................................. 324/304, 305, 324/300, 318, 322

[56] References Cited

U.S. PATENT DOCUMENTS

| | | | |
|---|---|---|---|
| 3,714,552 | 1/1973 | Hirschel | 324/0.5 |
| 3,728,614 | 4/1973 | Hearn | 324/304 |
| 3,873,908 | 3/1975 | Young | 324/304 |
| 4,327,327 | 4/1982 | Grenwood et al. | 324/304 |

FOREIGN PATENT DOCUMENTS 0288927  11/1988  European Pat. Off. .

OTHER PUBLICATIONS

"Narrow Line Rubidium Magnetometer for High Accuracy Field Measurements" by Allen et al. (J. Geomag. Geoelectr. 24) p. 105–125; Dec. 1972.

"Optically pumped atomic magnetometers after three decades" by Alexandrov et al.; Optical Engineering/Apr. 1992 vol. 31, No. 4, pp. 711–717.

Optical Engineering, Bd. 31, 1992; Seiten 711–717, XP000265429; E.B. Alexandrov, V.A. Bonch–Bruevich: "Optically Pumped Atomic Magnetometers After Three Decades" in der Anmeldung erwähnt siehe Seiten 714–715, Paragraph 4.2 und Fig. 6.

Journal of Geomagnetism & Geoelectricity, Bd. 24, 1972; Seiten 105–125, XP000576475 J.H. Allen, P.L. Bender: "Narrow Line Rubidium Magnetometer for High Accuracy Field Measurements" in der Anmeldung erwähnt siehe Seite 107, Absatz 2—Seite 109, Absatz 1; Abbildung 2; siehe Seiten 109–122, Paragraphen 2.1 und 2.2; siehe Seiten 113 unde 114, Paragraph 4.

"Modulation of a Light Beam by Precessing Absorbing Atoms" by H.G. Dehmelt; (Physical Review, vol. 105, No. 6, Mar. 15, 1975, pp. 1924 and 1925).

"Principles of Operation of the Rubidium Vapor Magnetometer" by Arnold L. Bloom; Jan. 1962, vol. 1, No. 1, Applied Optics, pp. 61–68.

"Optical Detection of Magnetic Resonance in Alkali Metal Vapor" by Bell et al. (Physical Review, vol. 107, No. 6, Sep. 15, 1957, pp. 1559–1565).

*Primary Examiner*—Louis Arana
*Attorney, Agent, or Firm*—Baker Botts L.L.P.

[57] ABSTRACT

Methods for obtaining a signal from optically pumped magnetometers are described in which a broadband self-oscillation magnetometer (31, 37) is coupled to an absorption cell (32, 40) in such a way that the self-oscillating magnetometer has the function of a voltage-controlled oscillator.

6 Claims, 3 Drawing Sheets

PROCESS AND DEVICE FOR RECOVERING SIGNALS FROM NARROW-BAND, OPTICALLY PUMPED MAGNETOMETERS

The invention relates to methods and devices for obtaining a signal by the principle of optically pumped magnetometers.

Optically pumped magnetometers have been known since the beginning of the sixties and since then have found increasing application in devices for measuring magnetic fields. With these magnetometers, for instance, the earth's magnetic field can be determined with exceptionally high accuracy. The basic theory and mode of operation of optically pumped magnetometers is known as such, the basic principle being always that a light beam of known polarisation and direction passes through a medium, usually caesium, but also potassium, helium or rubidium, thereby producing an output frequency, which corresponds to the amplitude of the local magnetic field.

In recent decades prior art has disclosed the development of various kinds of optically pumped magnetometers, the simplest embodiment being a self-oscillating Cs magnetometer in which a light beam tuned to a resonance line of caesium passes through an absorption cell filled with caesium and is incident on a photocell. The output signal of the photocell is amplified, phase shifted 90° and applied to the coil surrounding the absorption cell. In its tuned condition such a self-oscillating magnetometer generates a frequency f proportional to the surrounding magnetic field H:

$$f \sim (3.5 \text{ Hz/nT}) \cdot H$$

This type of magnetometer has, however, a systematic error and a relatively broad resonance line so that the generated frequency fails to correspond to the actual field value exactly.

This is why so-called tandem magnetometers (see FIG. 1) have been developed in which a self-oscillating magnetometer is coupled to a further narrow-band optical magnetometer. One such tandem magnetometer is disclosed, for example, by the paper of J. H. Allen et al. in J. Geomagn. Geoelectr. 24, pages 105–125 (1972). This magnetometer produces, however, a magnetic disturbance field and both sensors need to be arranged far removed from each other which is a big disadvantage. When, by contrast, an arrangement having a conventional voltage-controlled oscillator (VCO) is employed as demonstrated, for example, in the publication of E. B. Alexandrov et al. in OPTICAL ENGINEERING, April 1992, Vol. 31, No. 4, this results in a restricted dynamic response and problems in the case of fast-changing magnetic fields.

On the basis of this prior art it is thus the object of the present invention to define methods and devices for obtaining a signal by the principle of optically pumped magnetometers which can be implemented or operated at reduced electronics expense using a compact magnetometer arrangement producing no magnetic disturbance field.

Basically the invention involves using a broadband self-oscillating magnetometer as a voltage-controlled oscillator (VCO). In this embodiment of the invention the broadband self-oscillating portion of a tandem magnetometer is reconfigured so that this portion has the function of a voltage-controlled oscillator (VCO) in making use of a voltage-controlled frequency shift to tune the frequency of the self-oscillating magnetometer within a range. In a further embodiment of the invention, instead of making use of a conventional VCO in the arrangement according to Alexandrov et al. a broadband self-oscillating magnetometer is employed which operates like a VCO. The invention permits the configuration of a compact disturbance-free sensor.

The invention will now be described in more detail with respect to the Figures in which.

Figure 1:
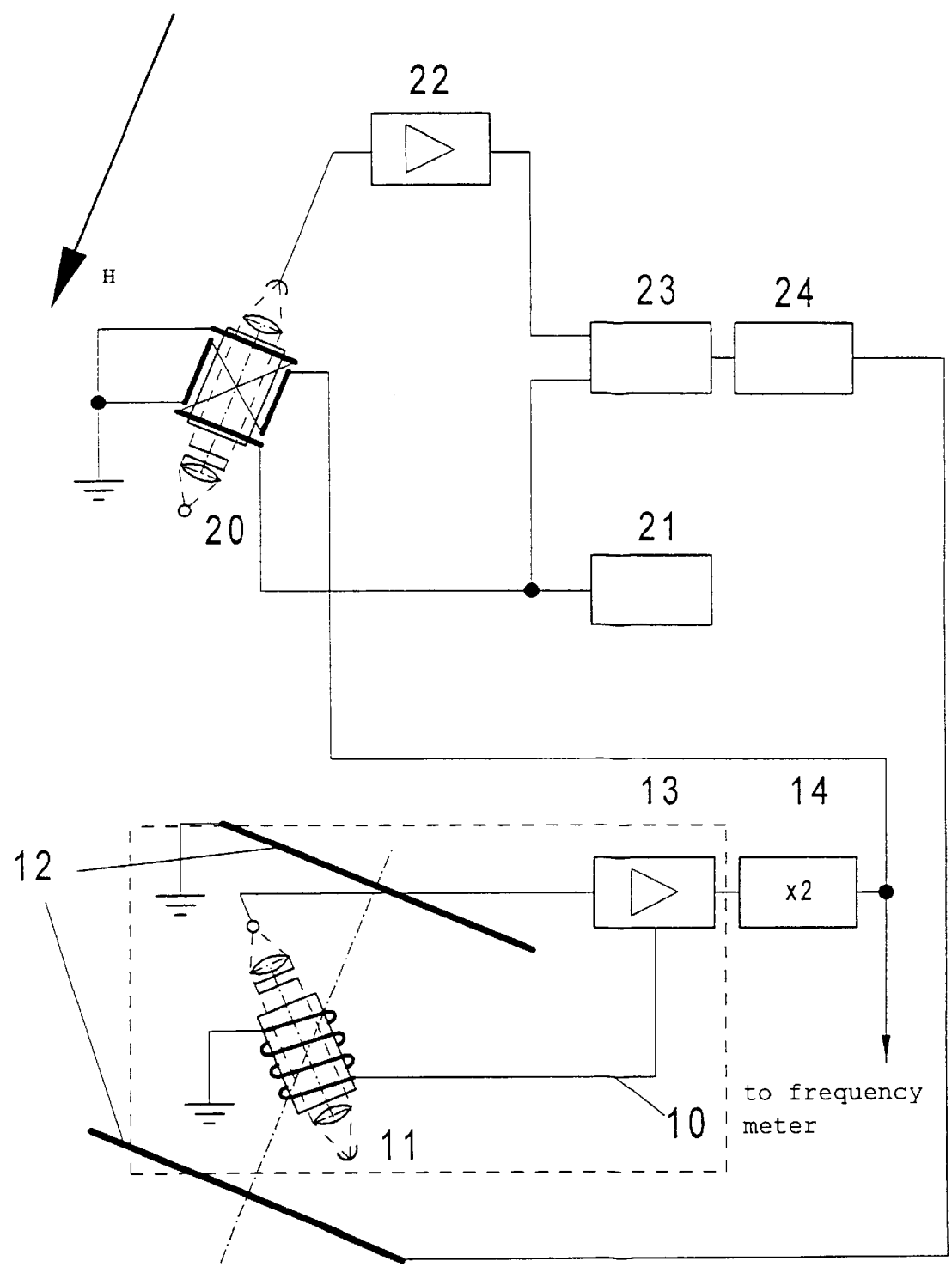
FIG. 1 is a tandem magnetometer in accordance with prior art.

FIG. 1 shows a tandem magnetometer in accordance with prior art in which a self-oscillating Cs magnetometer 10 is coupled to a narrow-band K absorption cell 20, the object of the complete arrangement being to measure the strength of the surrounding magnetic field H. In principle the output frequency of the self-oscillating magnetometer is multiplied according to the gyromagnetic ratio of the resonance used (for Rb, K:2, for He:8) and applied to the high-frequency coil of the narrow-band magnetometer. In the absorption cell 20 a low-frequency modulation is used to scan the narrow resonance line such that a phase signal is generated, the strength of which is a measure of the deviation from the resonance. This method is described in the publication by Allen et al. cited above. In this arrangement the magnetic field to be measured is modulated at a low frequency (in this case 5 Hz) by feeding a Helmholtz coil, the axis of which has been adjusted parallel to the direction of the magnetic field, from a low-frequency generator (21 in FIG. 1). The resonance frequency is applied to the absorption cell 20 with the aid of a coil oriented perpendicular to the magnetic field. Depending on whether the fed resonance frequency lies somewhat above or below the actual resonance frequency $f_0$ a 5 Hz signal appears at the output of the amplifier (22 in FIG. 1) in phase with the magnetic field or opposite thereto (see FIG. 4 of Allen and Bender).

By phase comparison in the phase-sensitive rectifier 23 an electrical signal is produced which is made use of to maintain the fed frequency at the resonance frequency $f_0$. In the case of FIG. 1, a current flows through the Helmholtz coil 12, the magnitude of this current being so large that twice the Cs frequency corresponds to the resonance of the K frequency (=$f_0$). The magnetic disturbance field is produced by this coil 12. In the vicinity of this coil, no precise measurement is further possible.

Specifically, the axial direction of the sensor 11 of the self-oscillating magnetometer is arranged at 45° to the direction of the outer field. The sensor is located in the middle of a Helmholtz coil pair 12 with which the magnetic field and thus the output frequency of the self-oscillating magnetometer can be varied. The output signal of the photocell of the sensor 11 is amplified in the usual way in an amplifier 13, shifted in phase by 90° and applied to the high-frequency coil of the sensor.

The output frequency of the self-oscillating magnetometer is additionally doubled in a frequency multiplier 14 and applied to the high-frequency coil of the K absorption cell 20. In a second pair of coils, oriented parallel to the direction of the field to be measured, a modulation is produced with the aid of the modulation frequency generator 21 and thus the narrow-band signal scanned. The output signal of the modulation frequency generator 21 and the output signal of the photocell of the K absorption cell amplified in the amplifier 22 are applied to a phase comparator or the phase-sensitive rectifier 23.

In response to the deviation of the output frequency of the self-oscillating magnetometer from the narrow resonance line the phase comparator produces a positive or negative signal and thus prompts an increase or reduction of the current applied to the Helmholtz coil pair 12. Between the phase comparator 23 and the Helmholtz coil pair 12 a low-pass filter, an integrator or a correction circuit 24 may also be connected. Due to a change in the magnetic field as a whole at the location of the sensor 11 the output frequency of the self-oscillating magnetometer is retuned to the narrow resonance line.

Since the Helmholtz coil 12 produces a magnetic disturbance field, both sensors need to be positioned far away from each other.

Figure 2:
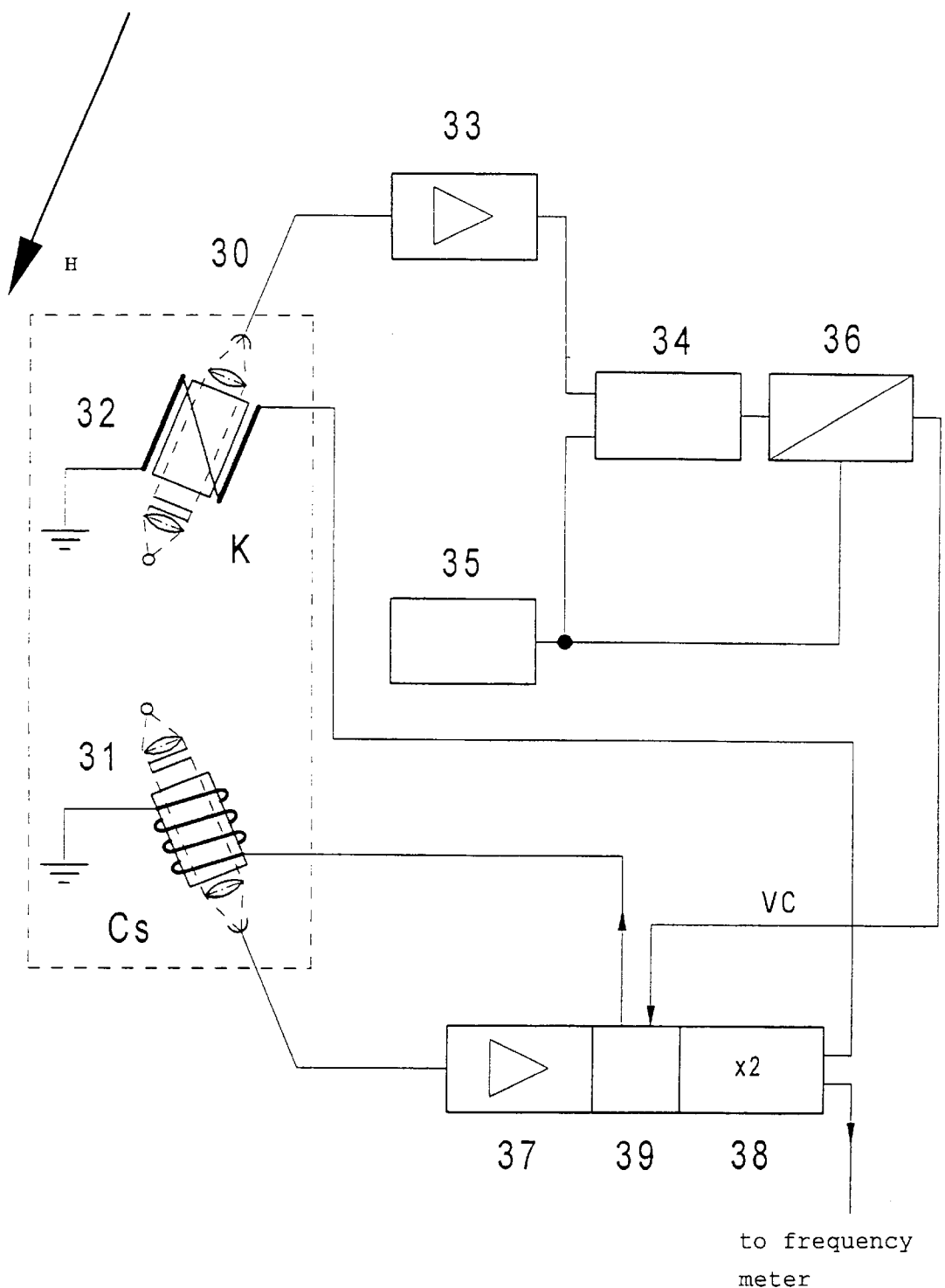
FIG. 2 is one embodiment of the present invention.

In FIG. 2 an embodiment of a magnetometer arrangement for implementing the method in accordance with the invention is shown. This arrangement permits combining the Cs and K magnetometer sensors 31 and 32 into a compact measuring head 30. The absorption cell of the K magnetometer sensor has preferably a very narrow resonance line (for example <10 nT). The output signal of the photocell of the K magnetometer sensor 32 is amplified in an amplifier 33 and applied to a first input of a phase sensitive detector 34, to the second input of which the signal of a modulation frequency generator 35 is applied.

The modulation frequency generator 35 has the same function as that shown in FIG. 1 except that, according to FIG. 2, an additional modulation coil for varying the magnetic field is eliminated and instead the resonance frequency is frequency modulated (e.g. low-frequency modulation with approx. 5 Hz). This can be done either with the phasing circuit 39 or preferably with the frequency multiplier 38 (configuration as a phase-locked loop, PLL).

In the self-oscillating portion the output signal of the photocell of the Cs magnetometer sensor 31 is applied to the amplifier 37, the output of which is connected to the high-frequency coil of the sensor 31. The output signal of the amplifier 37 is doubled in the frequency multiplier 38 and applied to the high-frequency coil of the narrow-band sensor 32, after, however, the output signal of the amplifier 37 having received a correction in frequency in a frequency correcting circuit 39 by the control signal applied from the phase sensitive detector 34 via the integrator/correction circuit 36.

The principle in accordance with the invention thus involves configuring the self-oscillating portion of the magnetometer so that it functions as a voltage-controlled oscillator (VCO).

The condition for prompting oscillations of a self-oscillating magnetometer in which the signal of the photocell is amplified and returned to the high-frequency coil is thus that this circuit has no loss (unity gain) and that the sum of all phase shifts within the circuit disappears. If, for example, the optical axis of the sensor and the axis of the high-frequency coil are oriented in parallel then the optical phase shift is −90° so that the sum of the electrical shifts in phase must be +90°. Any substantial violation of this condition causes the signal to disappear. By intentionally deviating from $\phi=+90°$ a frequency shift is achieved. Minor phase errors result in a frequency shift as follows:

When the phase shift in the sensor 31 (passive portion) is identified $\phi_K$ and the phase shift in the amplifier 37 $\phi_V$ then the oscillation condition is $$\phi = \phi_K + \phi_V = 0 \quad (1)$$

Assuming that a disturbance in the active portion (amplifier 37) produces a disturbance $\Delta\phi_V$ a change $\Delta\phi_K$ must automatically appear in the portion determining the frequency so that again $$\phi = 0 = \Delta\phi_V + \Delta\phi_K \quad (2)$$

This is achieved by the change in frequency $$\Delta f = (df/d\phi_K) \cdot \Delta\phi_K$$

Combining this with (2) results in $$\Delta f = -(df/d\phi_K) \cdot \Delta\phi_V$$

Accordingly, a phase shift in the amplifier 37 results in a proportional frequency shift which is determined solely by the factor $df/d\phi_K$ where $df/d\phi_K$ is a measure of the line width of the resonance. By intentionally changing all parameters it is very easy to achieve a broad line and thus an effective frequency shift with the aid of a voltage-controlled phase shift. The Helmholtz coils 12 as shown in FIG. 1 can thus be eliminated.

The advantages of this arrangement are as follows:

1. It is now possible to configure a compact sensor producing no magnetic disturbance field.
2. The electronic circuitry required is reduced considerably.
3. Delay-free tracking the resonance frequency due to changes in the magnetic field as well as a large dynamic range of 15,000 . . . 120,000 nT are now assured. The response is now achievable with less than 1 ms.
4. High long-term stability (below 0.05 nT) is achievable.
5. Measurements are now possible with an absolute accuracy of better than 0.05 nT.
6. No magnitude disturbance is generated so that measurements can now be done by the method in accordance with the invention in the immediate vicinity with further magnetometers.

In accordance with the invention cells may now be combined as follows, with adaptation to the gyromagnetic conditions where necessary: Cs (b)-Cs/He(n), Cs(b)-K(n), K(b)-K(n), Cs(b)-Ru(n), Ru(b)-Ru(n) where "b" stands for broad-band and "n" for narrow-band. Of these cell combinations Cs-Cs/He has the particular advantage that both cells can be operated with a common light source.

Figure 3:
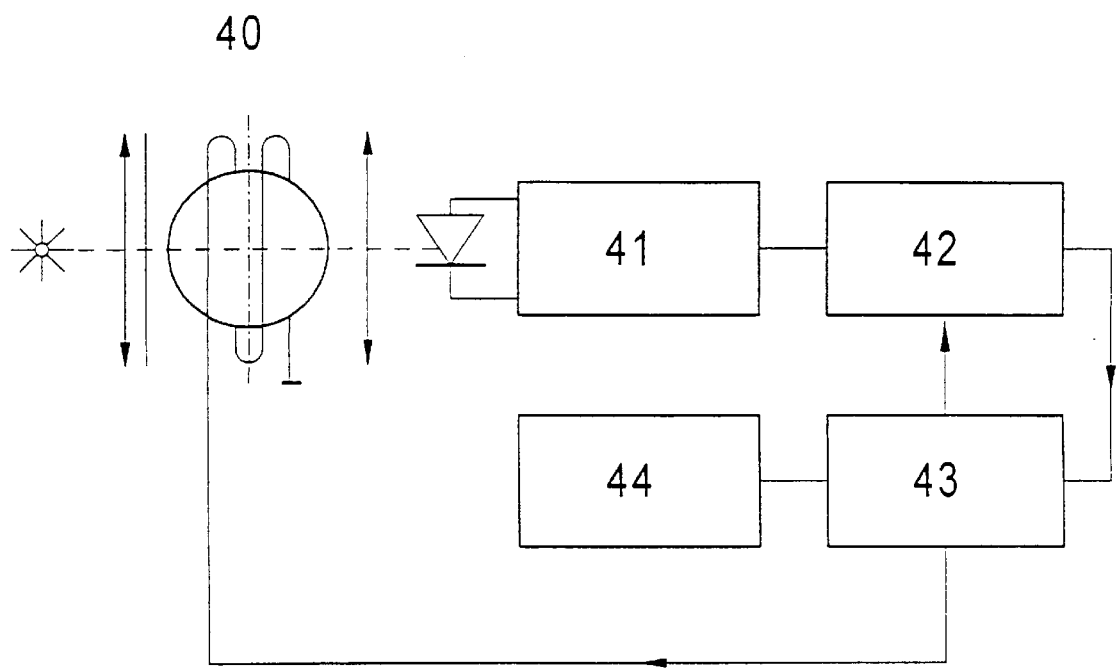
FIG. 3 is a further embodiment of the present invention.

A further device in accordance with the invention is shown in FIG. 3. The arrangement shown is known in principle from the publication by E. B. Alexandrov et al. in OPTICAL ENGINEERING, April 1992, Vol. 31, No. 4 and was originally developed for the use of potassium as the working medium. The magnetometer described here corresponds to the self-oscillating arrangement, i.e. the optical axis of the absorption cell 40 and direction of the magnetic field are at an angle of 45° to each other. However, the line structure of potassium makes it very difficult to build a self-oscillating magnetometer.

This is why the following procedure is made use of. The potassium has four resonance lines, the line having highest intensity corresponding to the lowest or highest resonance frequency depending on the nature of the light (cw/ccw circularly polarized). With the aid of a voltage-controlled oscillator (VCO) 43 the resonance of the strongest line is approached from below or above. On achieving resonance the photodiode amplifier 41 provides precisely the resonance frequency. By comparing the phase of the amplifier output to the frequency of the VCO by the phase sensitive detector 42 a voltage is produced for controlling the VCO. In accordance with the invention instead of a conventional VCO a self-oscillating broadband magnetometer is employed in such a way that it has the function of a voltage-controlled oscillator. As in the embodiment as shown in FIG. 2, here too, a correction signal is applied to a phase shifter of the self-oscillating magnetometer. In the example embodiment of FIG. 3 the comparator 42 produces the correction signal and applies it to the phase shifter of the self-oscillating magnetometer. With the frequency counter 44 the output frequency of the self-oscillating magnetometer can be measured. In this arrangement working materials other than potassium may be used.

With this arrangement an improved dynamic response as compared to that of the arrangement by Alexandrov et al. is achieved.

I claim:

1. A method of obtaining a magnetic field output signal having a frequency corresponding to the amplitude of a local magnetic field comprising:

operating a self-oscillating magnetometer cell comprising a sensor, an amplifier and a voltage controlled phase shift circuit as a voltage-controlled oscillator;

applying an output signal from said self-oscillating magnetometer cell to a high-frequency coil of a reference absorption cell in said local magnetic field operating on a resonance frequency having a narrow resonance line;

generating a control signal representing the deviation of said resonance frequency from the frequency of said self-oscillating magnetometer cell;

applying said control signal to said voltage-controlled phase shift circuit of said self-oscillating magnetometer cell such that a frequency shift is induced within said self-oscillating magnetometer cell that is proportional to the phase shift in said voltage-controlled phase shift circuit; and deriving said magnetic field output signal from said self-oscillating magnetometer cell.

2. A method of obtaining a magnetic field output signal having a frequency corresponding to the amplitude of a local magnetic field comprising:

operating a self-oscillating magnetometer cell comprising a sensor, an amplifier and a voltage controlled phase shift circuit as a voltage-controlled oscillator;

applying an output signal from said self-oscillating magnetometer cell to a high-frequency coil of a reference absorption cell in said local magnetic field operating on a resonance frequency having a narrow resonance line;

applying an output signal of said reference absorption cell to a first input of a phase-sensitive detector and applying an output signal of said self-oscillating magnetometer cell to a second input of said phase-sensitive detector to derive a control signal representing the deviation of said resonance frequency from the frequency of said self-oscillating magnetometer cell;

applying said control signal of said phase-sensitive detector to said voltage-controlled phase shift circuit such that a frequency shift is induced within said self-oscillating magnetometer cell which is proportional to the phase shift in said voltage-controlled phase shift circuit; and deriving said magnetic field output signal from said self-oscillating magnetometer cell.

3. A method according to claim 1 wherein said control signal is generated by applying an output signal of said reference absorption cell and an output signal from an oscillator to a phase sensitive detector and combining the output of said phase sensitive detector with the output signal of said oscillator.

4. A magnetometer system comprising:

a self-oscillating magnetometer cell comprising a sensor, an amplifier and a voltage-controlled phase shift circuit responsive to a control voltage for applying an output signal of said sensor to a high frequency coil of said self-oscillating magnetometer cell and providing a voltage-controlled output signal having a frequency controlled by said control voltage;

a reference absorption cell having a sensor and a high frequency coil connected to receive said voltage-controlled output signal of said self-oscillating magnetometer cell, said reference absorption cell operating on a resonance frequency having a narrow resonance line; and a circuit responsive to an output signal of said sensor of said reference absorption cell for providing said control signal representing the deviation of said resonance frequency from the frequency of said self-oscillating magnetometer cell.

5. A magnetometer system as specified in claim 4 wherein said circuit for providing said control signal comprises:

an amplifier for amplifying said sensor output signal of said reference absorption cell;

a phase sensitive detector responsive to the output of said amplifier and the output signal of an oscillator; and a circuit for combining the output of said phase sensitive detector and said oscillator output signal to provide said control signal.

6. A magnetometer system as specified in claim 4 wherein said circuit for providing said control signal comprises a phase-sensitive detector responsive to the output signal of said self-oscillating magnetometer cell and the output signal of said reference absorption cell.

* * * * *

UNITED STATES PATENT AND TRADEMARK OFFICE
CERTIFICATE OF CORRECTION

PATENT NO. : 6,054,852
DATED : April 25, 2000
INVENTOR(S) : Eberhard Pulz

It is certified that error appears in the above-identified patent and that said Letters Patent is hereby corrected as shown below:

Column 3, line 56: "$\phi=+90°$" should read -- $\varphi=+90°$ --;

Column 3, line 59: "$\phi_K$" should read -- $\varphi_K$ --; and "$\phi_V$" should read -- $\varphi_V$ --;

Column 3, line 61: "$\phi=\phi_K+\phi_V=0$" should read -- $\varphi=\varphi_K+\varphi_V=0$ --;

Column 3, line 63: "$\phi_V$" should read -- $\varphi_V$ --; and "$\phi_K$" should read -- $\varphi_K$ --;

Column 3, line 66: "$\phi=0=\Delta\phi_V+\Delta\phi_K$" should read -- $\varphi=0=\Delta\varphi_V+\Delta\varphi_K$ --;

Column 4, line 3: "$\Delta f=(df/d\phi_K)\cdot\Delta\phi_K$" should read -- $\Delta f=(df/d\varphi_K)\cdot\Delta\varphi_K$ --;

Column 4, line 6: "$\Delta f=-(df/d\phi_K)\cdot\Delta\phi_V$" should read -- $\Delta f=-(df/d\varphi_K)\cdot\Delta\varphi_V$ --;

Column 4, line 10: "$df/d\phi_K$" (both occurrences) should read -- $df/d\varphi_K$ --;

Column 4, line 67: "comparator" should read -- phase sensitive detector --.

Signed and Sealed this

Twenty-second Day of May, 2001

*Attest:*

NICHOLAS P. GODICI

*Attesting Officer*   Acting Director of the United States Patent and Trademark Office